United States Patent
Wang et al.

(10) Patent No.: US 8,237,210 B1
(45) Date of Patent: Aug. 7, 2012

(54) ARRAY TYPE CAM CELL FOR SIMPLIFYING PROCESSES

(75) Inventors: Zhigang Wang, Sunnyvale, CA (US); Kazuhiro Mizutani, Sunnyvale, CA (US); Richard Fastow, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 267 days.

(21) Appl. No.: 11/349,562

(22) Filed: Feb. 8, 2006

(51) Int. Cl.
*H01L 29/76* (2006.01)

(52) U.S. Cl. .............. 257/314; 257/296; 257/E29.129; 438/257

(58) Field of Classification Search ........... 257/E27.084, 257/296–326, E29.129; 438/239, 257; 365/49.1, 365/49.16; 711/108
See application file for complete search history.

(56) References Cited

U.S. PATENT DOCUMENTS

| | | | |
|---|---|---|---|
| 6,438,030 B1 * | 8/2002 | Hu et al. | 365/185.18 |
| 6,480,419 B2 * | 11/2002 | Lee | 365/185.18 |
| 2005/0083750 A1 * | 4/2005 | Sakagami | 365/222 |

* cited by examiner

*Primary Examiner* — Matthew E Warren
*Assistant Examiner* — John Lin

(57) ABSTRACT

A semiconductor apparatus is presented that includes an array of memory cells. The memory cells are arranged in rows and columns. Non-intersecting shallow trench isolation regions isolate the columns of memory cells. Also included is at least one source region that is isolated between an adjoining pair of the non-intersecting shallow trench isolation regions and isolated from a drain region. The source region is coupled to source lines in the array of memory cells. A contact couples a select plurality of the columns of memory cells, the select plurality functioning as a single content addressable memory cell.

10 Claims, 4 Drawing Sheets

ARRAY TYPE CAM CELL FOR SIMPLIFYING PROCESSES

TECHNICAL FIELD

The present invention relates to the field of semiconductor memory devices. Specifically, the present invention relates to an array-like content addressable memory cell for process simplicity.

BACKGROUND ART

Prior Art FIG. 1 is an illustration of a two CAM (content-addressable memory) cells 100a and 100b, according to conventional art. CAM cells 100a and 100b have a read path 110. Read transistors 130a and 130b, in read path 110, are employed by CAM cells 100a and 100b, respectively, to perform a read function. CAM cells 100a and 100b have a program path 120. Program transistors 140a and 140b, in program path 120, are employed by CAM cells 100a and 100b, respectively, to perform a programming function. Because reading necessitates a much larger current than does programming, read transistors 130a and 130b are much larger than program transistors 140a a and 140b. The difference in the sizes of the read and program transistors presents problems for photolithography and preclude using a chemical mechanical polishing (CMP) process. Also, the layout of a conventional CAM cell is itself an issue when attempting to use a CMP process to make a floating gate. In addition, the size of CAM cells 100a and 100b is relatively large in order to accommodate the large read transistors 130a and 130b, thus occupying a large amount of real estate in devices for which they are used.

SUMMARY

Embodiments of the present invention provide a semiconductor apparatus that includes an array of memory cells that are arranged in rows and columns. Non-intersecting shallow trench isolation regions isolate the columns of memory cells. Also included is at least one source region that is isolated between an adjoining pair of the non-intersecting shallow trench isolation regions and isolated from a drain region. The source region is coupled to source lines in the array of memory cells. A contact couples a select plurality of the columns of memory cells, the select plurality functioning as a single content addressable memory cell.

BRIEF DESCRIPTION OF THE DRAWINGS

The accompanying drawings, which are incorporated in and form a part of this specification, illustrate embodiments of the invention and, together with the description, serve to explain the principles of the invention. The drawings are not to scale.

Prior Art

DETAILED DESCRIPTION

Reference will now be made in detail to embodiments of the present invention, a semiconductor structure including an array of memory cells wherein select columns are coupled together to function as content addressable memory (CAM) cells, and a method for reading and programming the same. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 3:
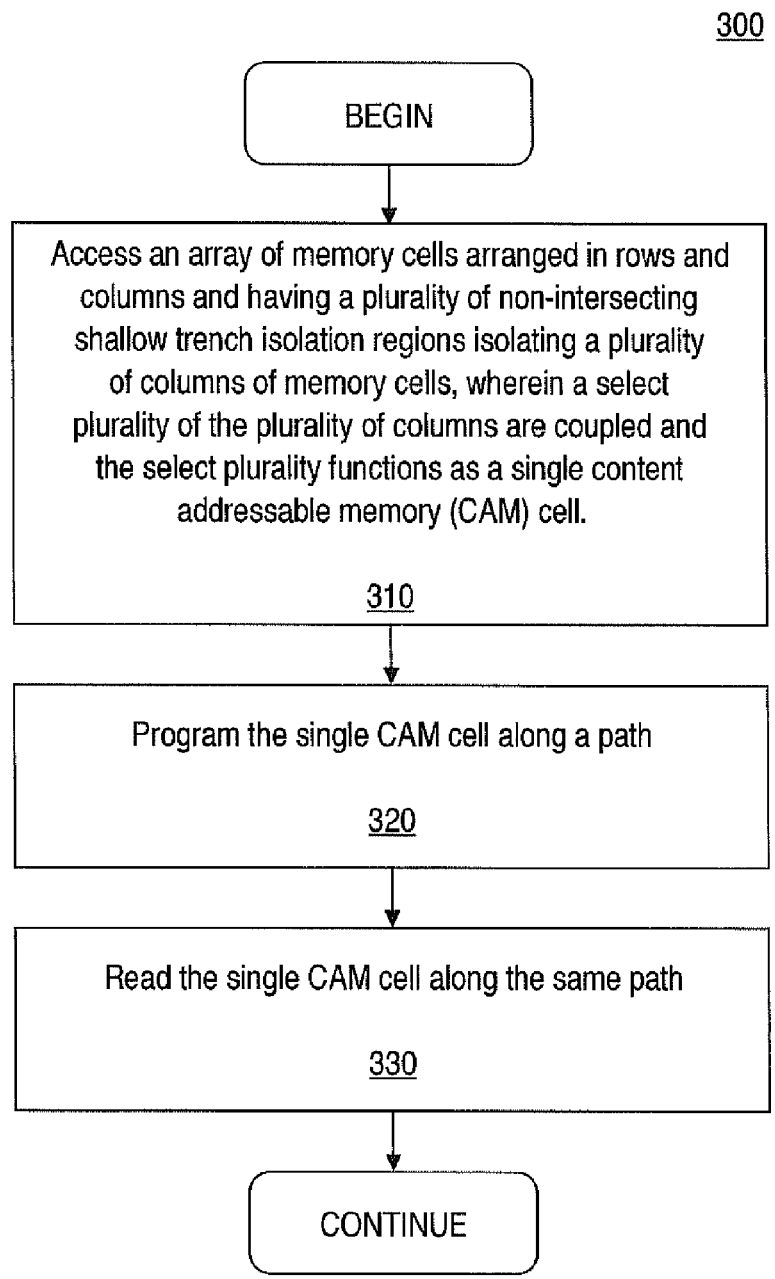
FIG. 3 is a flowchart illustrating a method for programming and reading an array-like CAM cell, in accordance with one embodiment of the present invention.

Certain portions of the detailed descriptions of embodiments of the invention, which follow, are presented in terms of processes and methods (e.g., flowchart 300 of FIG. 3). Although specific steps are disclosed herein describing the operations of these processes and methods, such steps are exemplary. That is, embodiments of the present invention are well suited to performing various other steps or variations of the steps recited in the processes and methods herein.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, embodiments of the present invention disclose a CAM cell device utilizing an array of memory cells such that a select group of columns of memory cells may be coupled to provide sufficient read current and to provide a common read and program path. Also, embodiments of the present invention disclose a method for programming and reading the CAM cell. The core array-like CAM cells lend themselves to current photolithography techniques and are compatible with chemical mechanical polishing (CMP) processes, such as poly-1 CMP processes.

Figure 1:
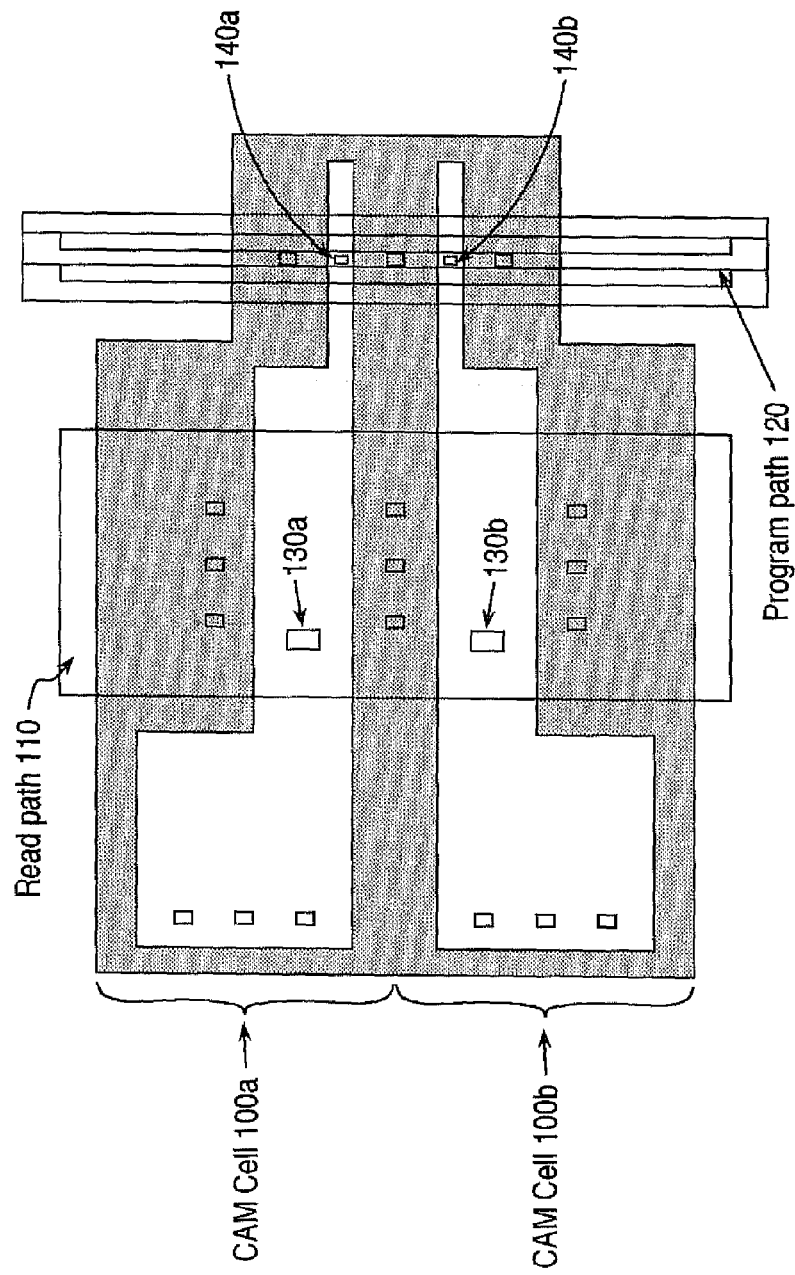
FIG. 1 is a planar view of two content addressable memory (CAM) cells, according to conventional art.
Figure 2:
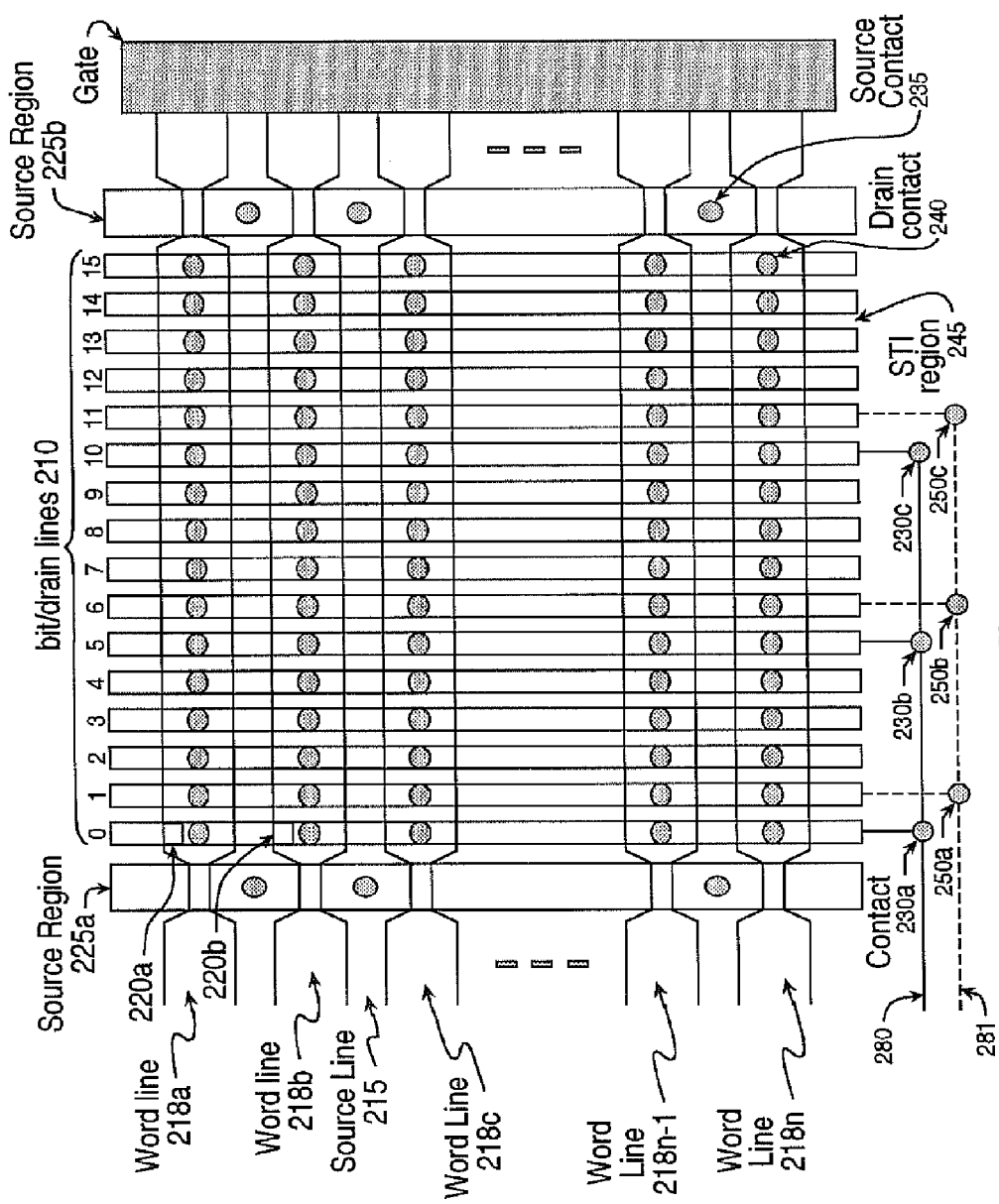
FIG. 2 is a planar view of a section of core memory array-like CAM cells, in accordance with one embodiment of the present invention.

FIG. 2 is a planar view of a section 200 of core memory array-like CAM cells, in accordance with one embodiment of the present invention. As shown in FIG. 2, the section 200 comprises a plurality of rows of memory cells, e.g., memory cells 220a and 220b. The section 200 also comprises a plurality of columns 0-15 of memory cells. Although not illustrated, it is understood that each of the columns 0-15 includes memory cells such as memory cells 220a and 220b, and that such memory cells extend the length of each column and each row. The columns are referred to herein as bit lines or drain lines. Each of the memory cells 220a, 220b, etc. is isolated from other memory cells by insulating layers. For example, a plurality of non-intersecting shallow trench isolation regions (STI) 245 isolate memory cells along the row direction, and a plurality of word lines 218a-218n and source lines 215 isolate memory cells in the column direction.

The control gates of each of the memory cells, e.g. memory cells 220a and 220b, in the array 200 are coupled together in each of the plurality of rows of memory cells, and form a plurality of word lines 218a, 218b, 218c, etc. that extend along the row direction, in accordance with one embodiment of the present invention.

Bit/drain lines 210 extend in the column direction and are connected to drain regions of associated memory cells via a plurality of drain contacts (e.g., drain contact 240) in associated columns 0-15 of memory cells, according to one embodiment. As such, each of the bit lines is connected to drain regions of memory cells in associated columns 0-15 of memory cells. Although the present embodiment is shown to have 16 columns of memory cells, or bit lines, there could be 8 columns, 16 columns, 24 columns or any multiple of 8 columns that would be compatible with the device for which it is intended. Source lines, e.g. source line 215, separate word lines, e.g., 218*b* and 218*c*. These source lines are connected to source sides of each of the memory cells 220*a*, 220*b*, etc. in the section 200 of an array of memory cells and connected to the common source region by source contacts, e.g., source contact 235, that occur along common source regions 225*a* and 225*b* in the column direction. The common source region 225*a* is also isolated between an adjoining pair of STI regions 245 and isolated from drain regions of memory cells, e.g., memory cells 220*a* and 220*b*. Also, as shown in FIG. 2, each of the word lines 218*a*, 218*b*, 218*c*, etc. has an associated row of drain contacts, e.g., drain contact 240.

Columns of memory cells 0, 5, and 10 may be connected by contacts 230*a*, 230*b* and 230*c*, to form a single (e.g. first) CAM cell inside periphery circuit 420 (FIG. 4), in accordance with one embodiment. The columns of memory cells that are coupled to form a CAM cell are also referred to herein as a "select plurality". Columns of memory cells 1, 6, and 11 may be connected by contacts 250*a*, 250*b* and 250*c*, to form a second CAM cell inside periphery circuit 420, etc. In this manner, a number of columns of memory cells can be chosen to produce a current that is sufficient for the read function of the CAM cell. Resistance in the memory cells varies by the distance they are from source regions, e.g., source region 225. By interleaving the rows of memory cells that form each CAM cell, as shown, the resistance differential that exists due to proximity to common source regions 225*a* and 225*b* can be dispersed among the CAM cells. This interleaving facilitates achieving the same read current in each CAM cell. As shown in the embodiment of FIG. 2, the contacts 230, 230*b*, and 230*c* are coupled in series to form a path 280, the contacts 250*a*, 250*b*, and 250*c* are coupled in series to form a path 281, and the paths 280 and 281 are parallel to one another.

FIG. 2 is exemplary only, and the pattern of word lines, source lines, and bit lines, and the way in which columns of memory cells are coupled to form a single CAM cell can be altered for performance reasons. In one embodiment, rather than being interleaved within the columns of memory cells, the CAM cells may be connected sequentially. In another embodiment, four columns or five columns may be coupled to form a single CAM cell. In yet another embodiment, the interleaving may be closer together (e.g., columns 0, 3, 6, and 9 may be coupled to form one CAM cell and columns 1, 4, 7, and 10 may form a second CAM cell). In another embodiment, the interleaving may be further apart. Any combination of rows, columns and couplings that performs according to the needs of the device for which it is intended may be used.

Importantly, FIG. 2 illustrates the formation of a CAM cell that is compatible with photolithography and with CMP processing, that occupies less real estate than a conventional CAM cell, that has a common read and program path and that can be fabricated to the performance needs of a device.

FIG. 3 is a flowchart 300 illustrating a method for programming and reading a CAM cell, in accordance with one embodiment of the present invention. In step 310, in the present embodiment, an array of memory cells is addressed. The array of memory cells is arranged in a matrix of rows and columns and has a plurality of non-intersecting shallow trench isolation regions isolating a plurality of columns of the memory cells. A select plurality of the plurality of columns of memory cells is coupled to function as a single CAM cell.

In step 320, in the present embodiment the single CAM cell is programmed along a path (e.g., a path that flows along the select plurality of columns of memory cells).

In step 330, in the present embodiment the single CAM cell is read along the same path with which it was programmed.

Figure 4:
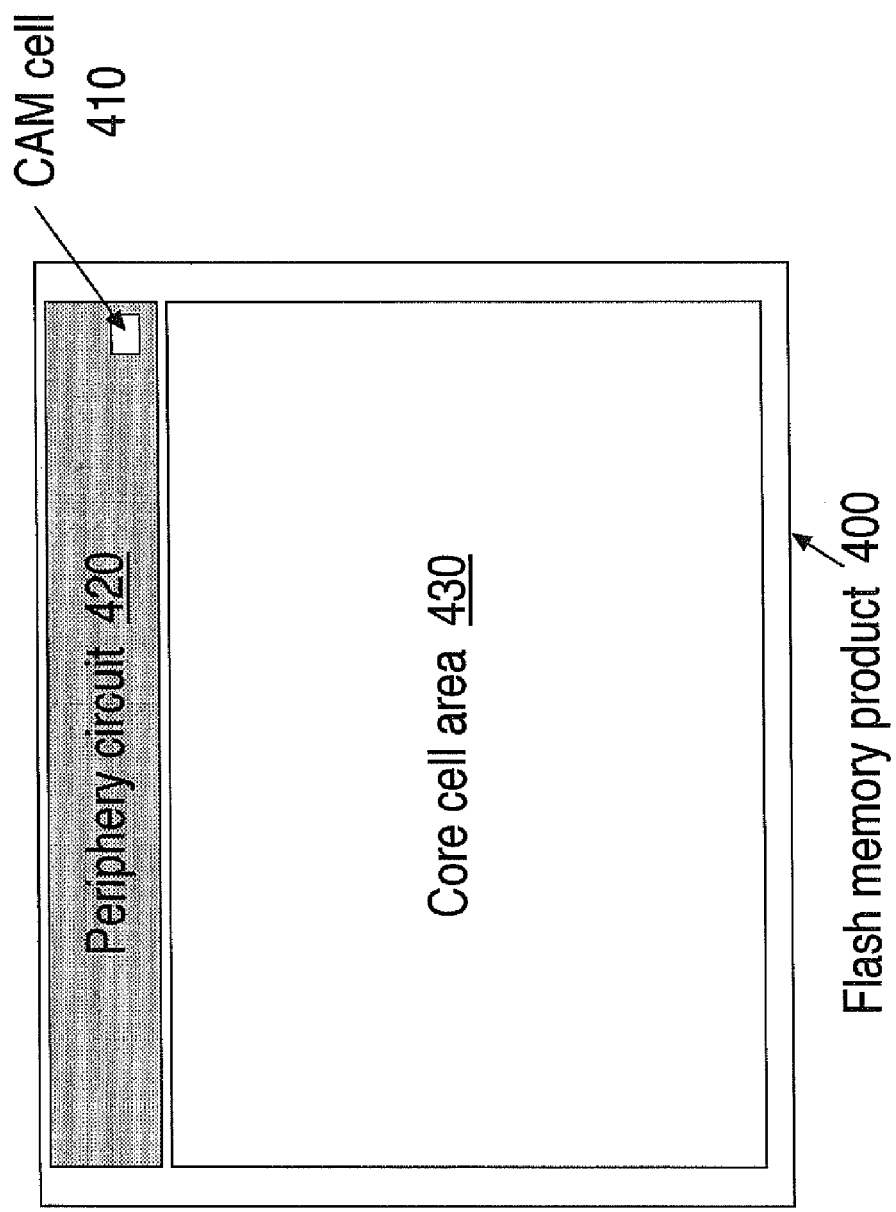
FIG. 4 is a block diagram of a CAM cell in a flash memory product according to one embodiment of the present invention.

FIG. 4 is a block diagram of a CAM cell 410 in a flash memory product 400 according to one embodiment of the present invention. A single CAM cell 410 is shown; in practice, there are many CAM cells. The flash memory product 400 includes a periphery circuit 420 and a core cell area 430. CAM cell 410 is used in periphery circuit 420 as a memory device that is external to core cell area 430 but inside the flash memory product 400. In such an embodiment, the core cell area 430 is for storing data, while CAM cell 410 is for storing system data for the flash memory product 400.

Embodiments of the present invention, an array-like cam cell for simplifying processes, are thus described. While the present invention has been described in particular embodiments, it should be appreciated that the present invention should not be construed as limited by such embodiments, but rather construed according to the following claims.

What is claimed is:

1. A semiconductor apparatus comprising:
   an array of memory cells arranged in rows and columns, wherein each of said columns is isolated from a neighboring column by a non-intersecting shallow trench isolation region;
   a plurality of word lines equal in number to the number of said rows, each of said word lines coupled to a memory cell per column;
   a plurality of bit lines equal in number to the number of said columns, each of said bit lines coupled to a respective one of said columns;
   at least one source region coupled to a plurality of source lines in said array of memory cells;
   a first single content addressable memory cell comprising a first plurality of serially connected contacts coupling a first select plurality of said columns to a first path but not to a second path, wherein said first path is in addition to said word lines and said bit lines; and
   a second single content addressable memory cell comprising a second plurality of serially connected contacts coupling a second select plurality of said columns to said second path but not to said first path, wherein said second path is in addition to said word lines and said bit lines, wherein columns in said first select plurality are different from and interleaved with columns in said second select plurality.

2. The semiconductor apparatus as described in claim 1, wherein said semiconductor apparatus is compatible with a chemical mechanical polishing (CMP) process.

3. The semiconductor apparatus as described in claim 1, wherein said plurality of columns comprises 16 columns.

4. The semiconductor apparatus as described in claim 1, wherein the number of bit lines in said first select plurality is selected to produce a desired current.

5. The semiconductor apparatus as described in claim 1, wherein a read path and a program path are the same.

6. A content addressable memory cell, comprising:
   a plurality of bit lines, each of said bit lines coupled to a respective column of an array of memory cells, said array of memory cells arranged in rows and columns having a plurality of non-intersecting shallow trench isolation regions isolating said columns of memory cells, wherein the number of said bit lines is equal to the number of said columns;

a plurality of word lines coupled to said columns, wherein the number of said word lines is equal to the number of said rows; and a first plurality of serially connected contacts coupling a first select plurality of said plurality of bit lines to a form a first path comprising said content addressable memory cell, wherein said content addressable memory cell is adjacent to a second content addressable memory cell comprising a second plurality of serially connected contacts coupling a second select plurality of bit lines to form a second path comprising said second content addressable memory cell, wherein bit lines in said first select plurality are different from and interleaved with bit lines in said second select plurality, wherein said first path and said second path are in addition to the number of said word lines and the number of said bit lines and wherein said content addressable memory cell is coupled to said first path but not to said second path and wherein said second content addressable memory cell is coupled to said second path but not to said first path.

7. The content addressable memory cell as described in claim 6, wherein said content addressable memory cell is compatible with a Chemical Mechanical Polishing (CMP) process.

8. The content addressable memory cell as described in claim 6, wherein said plurality of columns comprises 16 columns.

9. The content addressable memory cell as described in claim 6, wherein the number of bit lines in said first select plurality of bit lines is selected to produce a desired current.

10. The content addressable memory cell as described in claim 6, wherein a read path and a program path are the same.

* * * * *